United States Patent [19]

Wagner

[11] Patent Number: 4,523,090

[45] Date of Patent: Jun. 11, 1985

[54] LIGHT CONTROLLED FADER

[76] Inventor: Warren E. Wagner, P.O. Box 12025, Memphis, Tenn. 38122

[21] Appl. No.: 506,706

[22] Filed: Jun. 20, 1983

[51] Int. Cl.³ ............................................. H01L 31/08
[52] U.S. Cl. .................................... 250/211 K; 338/15
[58] Field of Search ....................... 250/211 K; 338/15

[56] References Cited

U.S. PATENT DOCUMENTS

| | | | |
|---|---|---|---|
| 3,087,069 | 4/1963 | Moncrieff-Yeates | 250/211 K |
| 3,205,365 | 9/1965 | Jones | 250/211 K |
| 4,283,702 | 8/1981 | Meyer et al. | 338/15 |

*Primary Examiner*—John D. Welsh
*Attorney, Agent, or Firm*—Walker & McKenzie

[57] ABSTRACT

A light controlled fader for providing an analog voltage output of approximately linear proportion to the position of a slider-type control mechanism. The fader includes coacting first light emitting and receiving members and coacting second light emitting and receiving members. A control member is provided to allow the amount of light received by the first and second light receiving members to be varied in an inverse proportion to one another.

6 Claims, 10 Drawing Figures

LIGHT CONTROLLED FADER

BACKGROUND OF THE INVENTION

1. Field of the Invention:

The present invention relates, in general, to means for providing analog control voltage.

2. Description of the Prior Art:

A fader is a mechanism used in various electrical systems to provide, for example, audio volume control in recording studios and the like to allow gradual emergence of sound being recorded between silence and full volume. Heretofore, conventional faders used sliding contact electrodes to provide an analog voltage output of approximately linear proportion to the position of a slide-type control mechanism.

SUMMARY OF THE INVENTION

The present invention is directed toward improving prior faders. The concept of the present invention is to provide a light controlled fader to eliminate the noise associated with the mechanical sliding contact electrodes of conventional faders, and also to provide for user adjusted "taper" of such devices.

The light controlled fader of the present invention includes, in general, a first light emitting means; a first light receiving means for receiving light from the first light emitting means and for producing a voltage output proportional to the amount of light received from the first light emitting means; a second light emitting means; a second light receiving means for receiving light from the second light emitting means and for producing a voltage output proportional to the amount of light received from the second light emitting means; and control means for varying the amount of light received by the first and second light receiving means from the first and second light emitting means in an inverse proportion to one another.

DESCRIPTION OF THE PREFERRED EMBODIMENT

Figure 1:
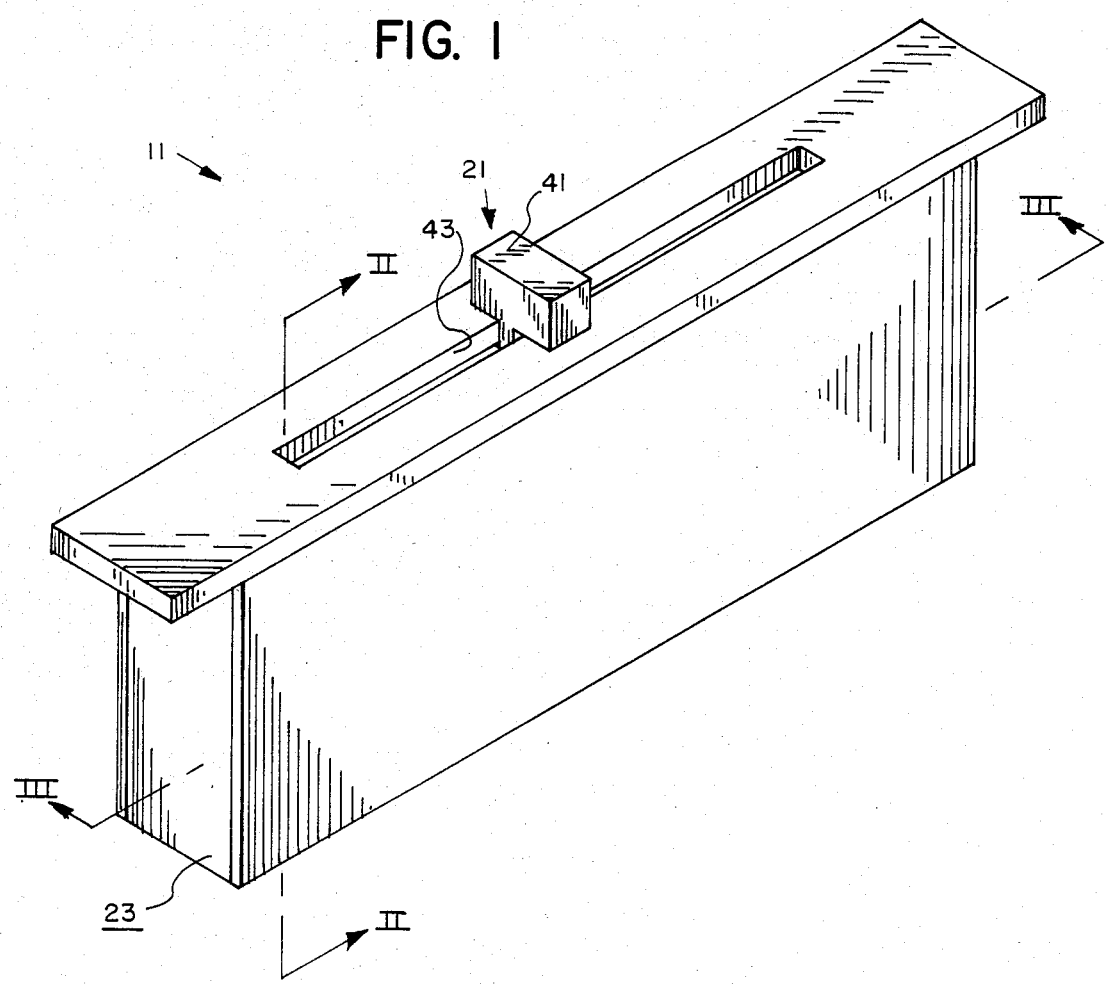
FIG. 1 is a perspective view of the light controlled fader of the present invention.
Figure 2:
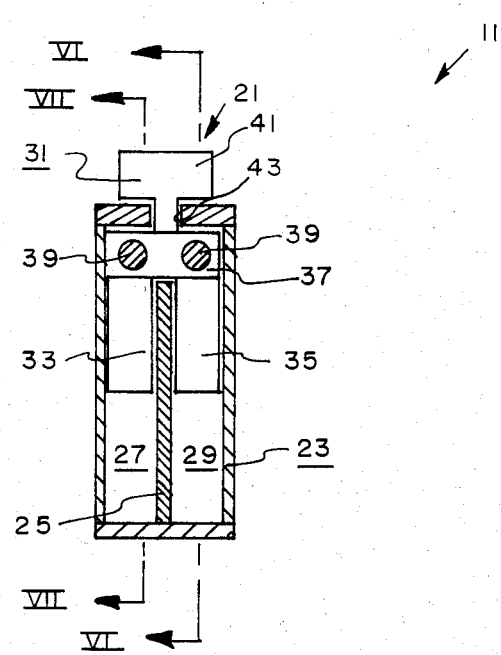
FIG. 2 is a sectional view substantially as taken on line II—II of FIG. 1.
Figure 3:
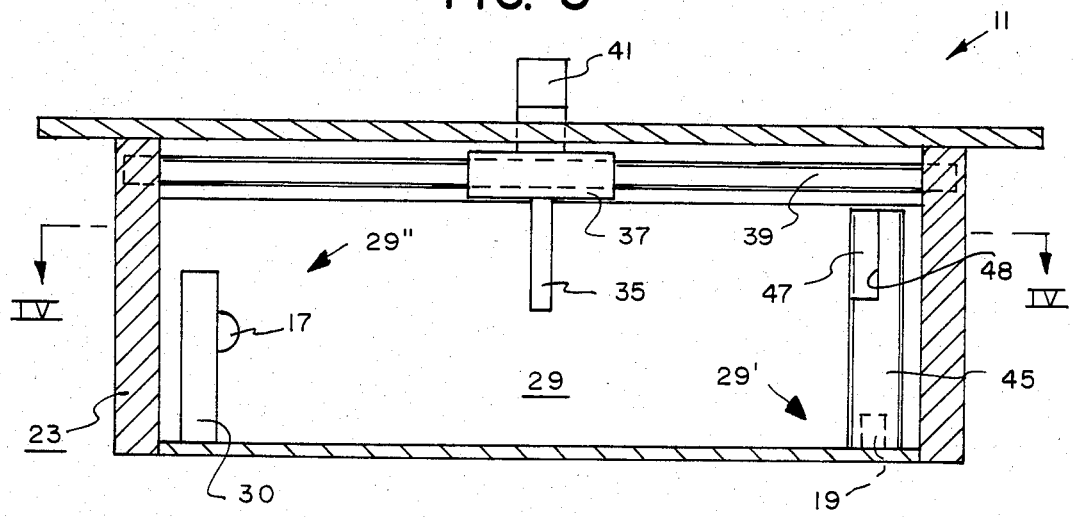
FIG. 3 is a sectional view substantially as taken on line III—III of FIG. 1.

The light controlled fader 11 of the present invention comprises, in general, a first light emitting means, such as incandescent bulb or a light emitting diode 13, a first light receiving means, such as a photocell or a pin photodiode 15 for receiving light from the light emitting diode 13 and for producing a voltage output proportional to the amount of light received from the light emitting diode 13, a second light emitting means, such as a light emitting diode 17, a second light receiving means, such as a pin photodiode 19 for receiving light from the light emitting diode 17 and for producing a voltage output proportional to the amount of light received from the light emitting diode 17, and control means 21 for varying the amount of light received by the pin photodiodes 15, 19 from the respective light emitting diodes 13, 17 in an inverse proportionate to one another.

Figure 4:
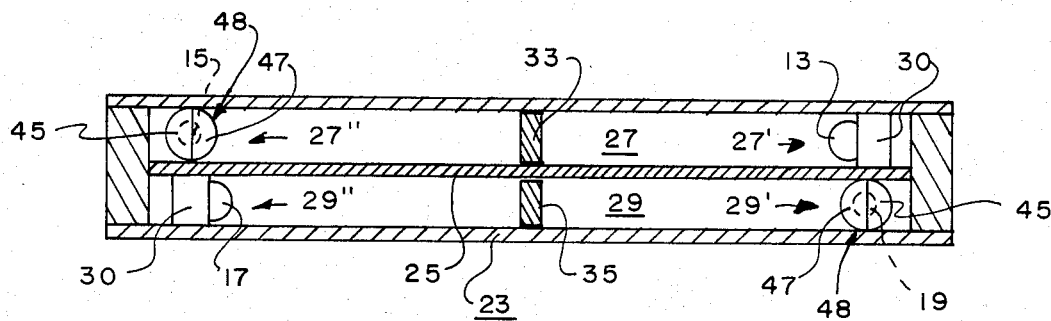
FIG. 4 is a sectional view substantially as taken on line IV—IV of FIG. 3.

The fader 11 preferably includes a substantially light-tight box 23 having a hollow interior divided by an opaque partition 25 into a first compartment 27 having a first end 27' and a second end 27", and a second compartment 29 having a first end 29' and a second end 29" (see, in general, FIG. 4). The box 23 and partition 25 can be constructed in any manner apparent to those skilled in the art. For example, the box 23 and partition 25 may be molded from an opaque plastic material or the like.

The light emitting diode 13 and pin photodiode 15 are located in the first compartment 27 at opposite ends thereof. Thus, the light emitting diode 13 may be attached adjacent the first end 27' of the first compartment 27 and the pin photodiode 15 may be fixed relative to the second end 27" of the first compartment 27 (see, in general, FIGS. 7 and 8). Likewise, the light emitting diode 17 and pin photodiode 19 are located in the second compartment 29 at opposite ends thereof. Thus, the light emitting diode 17 may be fixed relative to the second end 29" of the second compartment 29 and the pin photodiode 19 may be fixed relative to the first end 29' of the second compartment 29 (see, in general, FIGS. 6 and 9). The light emitting diodes 13, 17 may be attached to posts 30 mounted in the compartments 27, 29 (see, in general, FIGS. 6-9).

Figure 6:
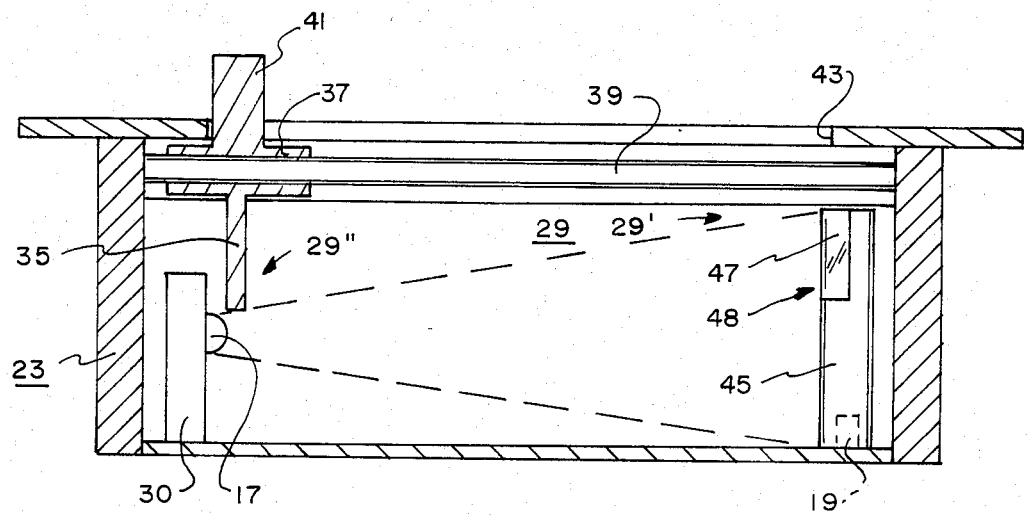
FIG. 6 is a sectional view substantially as taken on line VI—VI of FIG. 2 but showing the control means of the fader in a first extreme position thus allowing maximum light coupling between the second light emitting means and the second light receiving means.
Figure 7:
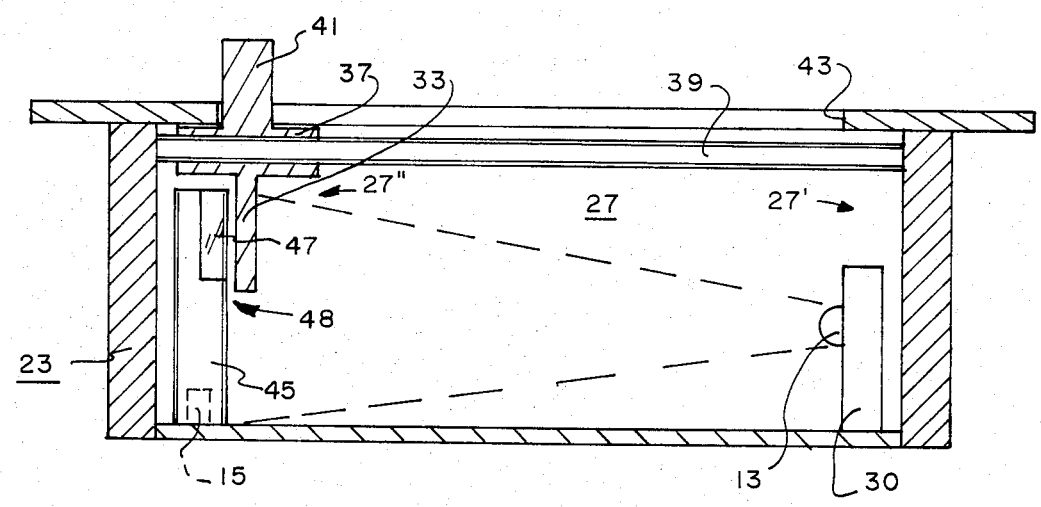
FIG. 7 is a sectional view substantially as taken on line VII—VII of FIG. 2 but showing the control means of the fader in the first extreme position thus allowing minimum light coupling between the first light emitting means and the first light receiving means.
Figure 8:
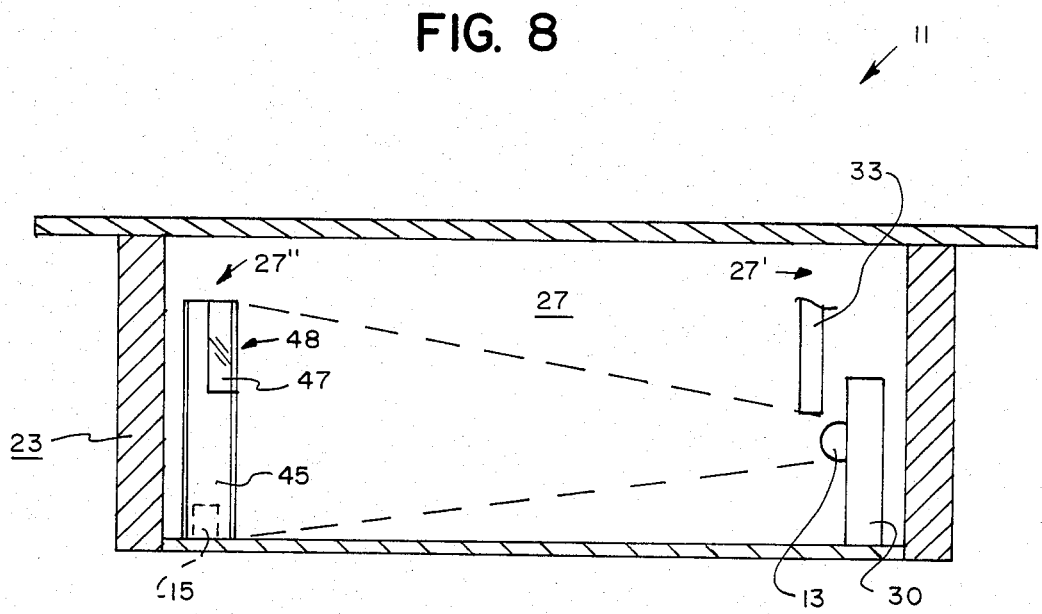
FIG. 8 is a somewhat diagrammatic sectional view substantially similar to FIG. 7 but showing the control means of the fader in a second extreme position thus allowing maximum light coupling between the first light emitting means and the first light receiving means.
Figure 9:
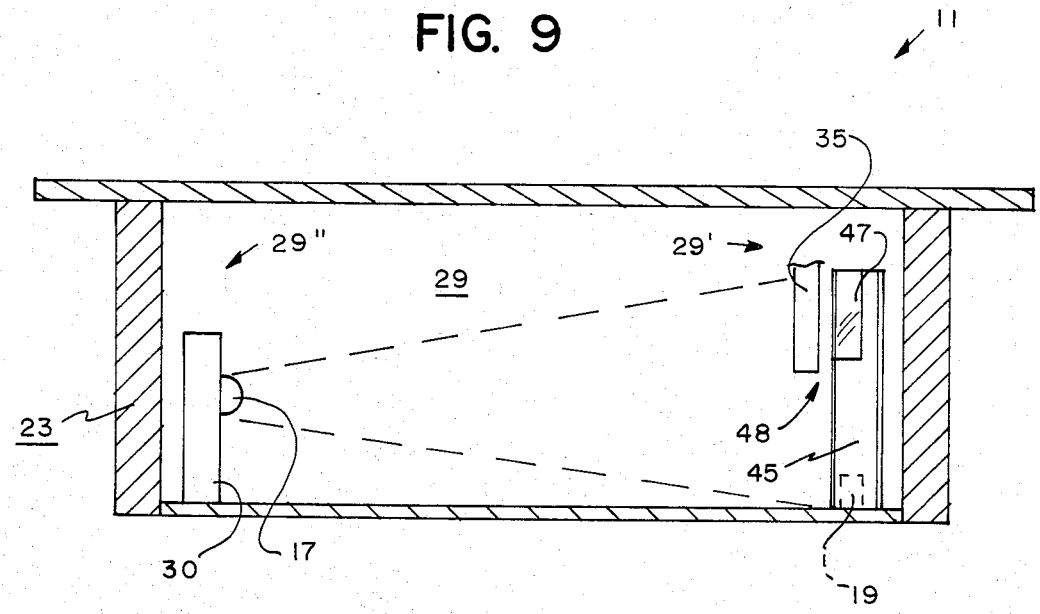
FIG. 9 is a somewhat diagrammatic sectional view substantially similar to FIG. 6 but showing the control means of the fader in the second extreme position thus allowing minimum light coupling between the second light emitting means and the second light receiving means.

The control means 21 includes a slide means 31 for selective movement in a direction between the first and second ends of the first and second compartments 27, 29. The slide means 31 includes a first light obstruction member 33 located in the first compartment 27 for sliding movement in a direction between the first and second ends 27', 27" of the first compartment 27 to produce a variable attenuation of the light beam from the light emitting diode 13 to the pin photodiode 15. The slide means 31 also includes a second light obstruction member 35 located in the second compartment 29 for sliding movement in direction between the first and second ends 29', 29" of the second compartment 29 to produce a variable attenuation of the light means from the light emitting diode 17 to the pin photodiode 19. The first and second light obstruction members 33, 35 are fixed relative to one another for movement together in such a manner that when the first light obstruction member 33 is in a first extreme position to allow minimum light coupling between the light emitting diode 13 and the pin photodiode 15 as shown in FIG. 7, the second light obstruction member 35 is positioned to allow maximum light coupling between the light emitting diode 17 and the pin photodiode 19 as shown in FIG. 6, and, vice versa, when the second light obstruction member 35 is in a second extreme position to allow minimum light coupling between the light emitting diode 17 and the pin photodiode 19 as shown in FIG. 9, the first light obstruction member 33 is positioned to allow maximum light coupling between the light emitting diode 13 and the pin photodiode 15 as shown in FIG. 8.

The first and second light obstruction members 33, 35 may consist of light opaque tab-like members fixedly mounted on a body member 37 that is in turn slidably mounted on elongated rod members 39 extending between the first and second ends of the first and second compartments 27, 29. A handle 41 is attached to the body member 37 and extends outwardly through a slot 33 in the box 23 to allow manual sliding movement of the body member 37 and, therefore, the first and second light obstruction members 33, 35 in a direction between the first and second ends of the first and second compartments 27, 29. Thus, the slot 43 extends generally between the first and second ends of the first and second compartments 27, 29. The first and second light obstruction members 33, 35, body member 37 and handle 41 may be molded as a single, unitary component from light opaque plastic or the like.

Figure 5:
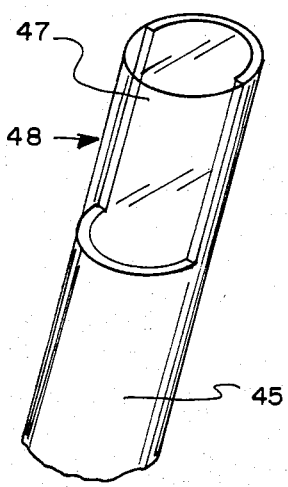
FIG. 5 is a perspective view of a portion of one of the light receiving means of the fader of the present invention.

Each of the first and second light receiving means may include, in addition to the pin photodiodes 15, 19, an opaque tube 45 extending upward from each pin photodiodes 15, 19 and filled with translucent silicone sealant material 47 to transmit diffused average light intensities to the pin photodiodes 15, 19 (see, in general, FIG. 5). Rather than an opaque tube filled with translucent material, the means may include a glass tube with a mirrored treated inner surface. A window 48 or the like is provided on each tube 45 to allow light from the respective photodiodes 15, 19 to enter. The window 48 may consist simply of an opening adjacent the upper end of each tube 45.

Figure 10:
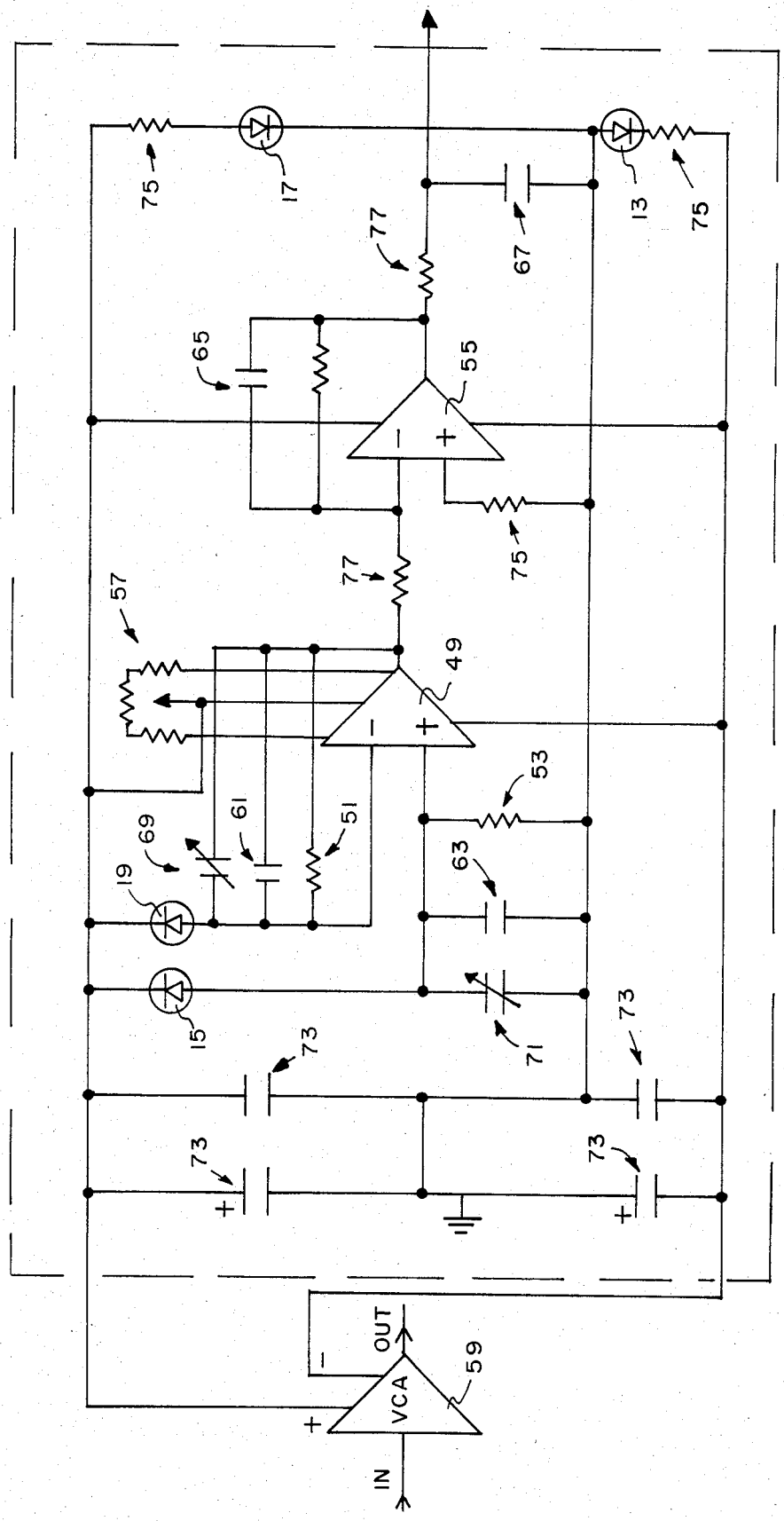
FIG. 10 is an electrical schematic showing the light controlled fader of the present invention coupled to a scaling amplifier circuit.

The fader 11 has various applications where an analog voltage output of approximately linear proportion to the position of a control mechanism is desired. The fader 11 may be used in conjunction with a scaling amplifier circuit as shown schematically in FIG. 10. The light emitting diodes 13, 17 of the schematic shown in FIG. 10 preferably consist of Hewlett Packard p/n HEMT-3300 670 nm high radiant intensity emitters with a narrow beam angle (half intensity total angle equals 22 degrees). The pin photodiodes 15, 19 are Hewlett Packard p/n 5082-4207 high sensitivity, wide dynamic range, low noise, high stability light detectors with one millimeter diameter active area. The photocurrent outputs of the pin photodiodes 15, 19 are differentially amplified by a very high input impedance LF 356 JFET input operational amplifier 49. The gain of the amplifier 49 is set by resistors 51, 53 and is nominally 10 volts/microamp of differential photodiode current. Amplifier 55 (LF356 operational amplifier) provides a direct current gain of 1500 (nominal) to yield an output voltage change of approximately 15 volts from extreme left to extreme right slide means 31 position. The variable resistor 57 is adjusted to provide a direct current offset, resulting in a control voltage of minus two volts at one extreme slide means 31 position and plus thirteen volts at the other extreme. When approximately connected to a voltage control amplifier 59 hving a gain of minus ten dB/volts, the resulting gain range is plus twenty d/B to minus 130 d/B. The capacitors 61, 63, 65, 67 interact with the gain resistors to provide a three-pole low pass filter characteristic. The values of these capacitors can be adjusted to accomodate the desired three-pole filter breakpoints and time delay as in conventional active filter design. The variable capacitors 69, 71 are optional and may be used to balance the input capacitance of the detector amplifier used to enhance alternating current common mode rejection. Power supply by-past capacitors 73, power supply isolating resistors 75, and isolating resistors 77 are preferably provided as shown in FIG. 10. The construction and operation of the fader 11 will now be apparent to those skilled in the art.

As thus constructed, the light controlled fader of the present invention provides an analog voltage output of approximately linear proportion to the position of the slide means 31 by mechanically varying the attentuation of beams of light between the light emitting diodes, 13, 17, and the pin photodiode means 15, 19 without the use of sliding contact electrodes. One principal merit of the fader 11 is the elimination of noise associated with the sliding contact electrodes of conventional faders.

Although the present invention has been described and illustrated with respect to a preferred embodiment thereof and a preferred use therefore, it is not to be so limited since changes and modifications can be made therein which are within the full intended scope of the invention.

I claim:

1. A light controlled fader for providing an analog voltage output, said fader comprising:
   (a) a first light emitting means;
   (b) a first light receiving means for receiving light from said first light emitting means and for providing a voltage output proportional to the amount of light received from said first light emitting means;
   (c) a second light emitting means;
   (d) a second light receiving means for receiving light from said second light emitting means and for producing a voltage output proportional to the amount of light received from said second light emitting means; and
   (e) control means for varying the amount of light received by said first and second light receiving means from said first and second light emitting means in an inverse proportion to one another.

2. The fader of claim 1 in which is included a substantially light-tight box having a hollow interior divided by an opaque partition into a first compartment having first and second ends and a second compartment having first and second ends, said first light emitting means and said first light receiving means being located at opposite ends of said first compartment, said second light emitting means and said second light receiving means being located at opposite ends of said second compartment.

3. The fader of claim 2 in which said control means includes a slide means for selective movement in a direction between said first and second ends of said first and second compartments, said slide means including a first light obstruction member located in said first compartment for sliding movement in a direction between said first and second ends of said first compartment to produce a variable attenuation of the light beam from said first light emitting means to said first light receiving means, said slide means including a second light obstruction member located in said second compartment for sliding movement in a direction between said first and second ends of said second compartment to produce a variable attentuation of the light beam from said second light emitting means to said second light receiving means.

4. The fader of claim 3 in which said first and second light obstruction members are fixed relative to one another for movement together in such a manner that when said first light obstruction member is positioned to allow maximum light coupling between said first light emitting means and said first light receiving means, sid second light obstruction member is positioned to allow minimum light coupling between said second light emitting means and said second light receiving means, and that when said second light obstruction member is positioned to allow maximum light coupling between said second light emitting means and said second light receiving means, said first light obstruction member is positioned to allow minimum light coupling between said first light emitting means and said first light receiving means.

5. The fader of claim 4 in which each of said first and second light emitting means includes a light emitting diode, and in which each of said first and second light receiving means includes a pin photodiode.

6. The fader of claim 5 in which each of said first and second light receiving means includes an opaque tube filled with translucent silicone sealant material to transmit diffused averaged light intensitives to said pin photodiode.

* * * * *